(12) United States Patent  
Kato et al.

(10) Patent No.: US 7,791,148 B2  
(45) Date of Patent: Sep. 7, 2010

(54) SEMICONDUCTOR DEVICE

(75) Inventors: Katsuhiro Kato, Tokyo (JP); Kenji Ichikawa, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 24 days.

(21) Appl. No.: 11/624,656

(22) Filed: Jan. 18, 2007

(65) Prior Publication Data  
US 2007/0187782 A1   Aug. 16, 2007

(30) Foreign Application Priority Data  
Feb. 15, 2006 (JP) .............................. 2006-038580

(51) Int. Cl.  
H01L 29/76 (2006.01)  
H01L 29/94 (2006.01)  
H01L 31/062 (2006.01)  
H01L 31/113 (2006.01)  
H01L 31/119 (2006.01)

(52) U.S. Cl. ............... 257/409; 257/362; 257/355; 257/316; 257/E21.177; 257/E21.639; 438/275; 438/200

(58) Field of Classification Search ............... 257/409, 257/362, 355, 316, E21.177, E21.639; 438/275, 438/200, 202  
See application file for complete search history.

(56) References Cited  
U.S. PATENT DOCUMENTS  
6,624,487 B1   9/2003 Kunz et al.  
2005/0227440 A1*  10/2005 Ema et al. ................ 438/275  
2007/0018250 A1*  1/2007 Cai et al. .................. 257/368  
\* cited by examiner

*Primary Examiner*—Cuong Q Nguyen  
*Assistant Examiner*—Cathy N Lam  
(74) *Attorney, Agent, or Firm*—Volentine & Whitt, P.L.L.C.

(57) ABSTRACT

A semiconductor device includes a transistor region, a first guard ring, a second guard ring, and a silicide region. A first-conductive-type transistor is formed in the transistor region. The first guard ring is a second-conductive-type first impurity diffusion layer surrounding the transistor region with a first width, and is coupled to a first reference potential. The second guard ring is a first-conductive-type transistor second impurity diffusion layer surrounding the first guard ring with a second width. The silicide region is formed on the surface of the second guard ring such that substantially no silicide is formed on a portion of the surface of the second guard ring on the side facing a drain region of the first-conductive-type transistor, and is connected to a second reference potential line whose potential is higher than that of the first reference potential line.

7 Claims, 16 Drawing Sheets

SEMICONDUCTOR DEVICE

This application claims priority to Japanese Patent Application No. 2006-038580. The entire disclosure of Japanese Patent Application No. 2006-038580 are hereby incorporated herein by reference.

BACKGROUND OF THE INVENTION

Field of the Invention

The present invention relates to protection technology against electrostatic destruction in a semiconductor device.

In general, a semiconductor device is provided with an electrostatic discharge (ESD) protection circuit so that it is not destroyed by an ESD surge that is externally input through an input terminal (or an output terminal). FIG. 1 shows an example of a semiconductor device into which the ESD protection circuit is implemented.

FIG. 1 is a schematic diagram of a conventional semiconductor device (i.e., input/output circuit) into which an ESD protection circuit is implemented. The semiconductor device shown in FIG. 1 includes a CMOS input/output circuit 600 and protection transistors Q30, Q40, and Q50. The CMOS input/output circuit 600 is comprised of output transistors Q10 and Q20, a current limiting resistance R1, and an inverter INV1. The protective transistors Q30, Q40, and Q50 use snapback operations by means of parasitic bipolar.

When an negative ESD surge is applied to an input/output terminal IN/OUT in the semiconductor device, the ESD surge is absorbed by current that flows through a path CP1 indicated by an arrow in FIG. 1. As shown in FIG. 1, current flowing through the path CP1 sequentially flows through a power supply terminal VDD, the transistor Q50, a ground terminal GND, the transistor Q30, and the input/output terminal IN/OUT indicated by an arrow in the figure. Accordingly, the CMOS input/output circuit 600 is protected from the ESD surge. The protection transistor is designed to withstand a surge voltage (e.g., 2 kV) defined by the human body model (HBM), for instance.

In addition, latch-up may generally occur in a semiconductor device like that shown in FIG. 1. Latch-up is a phenomenon in which a parasitic thyristor (i.e., pnpn structure) is switched on because of the CMOS structure, and excess current flows between the power supply terminal VDD and the ground terminal GND (or a VSS level). If latch-up occurs, a device may be destroyed in the worst case. Therefore, providing a guard ring around a transistor region that is to be protected has been conventionally known as a method configured to prevent latch-up from occurring.

In general, double guard rings are provided as guard rings for the semiconductor device. The double rings are comprised of a first guard ring that surrounds a transistor region to be protected, and an external guard ring that surrounds the first guard ring. The first guard ring functions as a potential fixing layer and is made of an impurity diffusion layer whose conductive type is opposite from that of the transistor to be protected. The second guard ring functions as a latch-up protection layer, and is made of an impurity diffusion layer whose conductive type is the same as that of the transistor to be protected. The double rings are provided for each type of transistors with different conductive types (i.e., NMOS transistor and PMOS transistor) in order to perform latch-up protection. For example, in the semiconductor device shown in FIG. 1, double guard rings are provided for the NMOS transistors Q10 and Q30. In addition, double guard rings are provided for the PMOS transistors Q20 and Q40.

A conventional semiconductor device structure in which latch-up protection is performed by the guard rings is hereinafter explained with reference to FIGS. 2 and 3. FIG. 2 is a plan view of an example of a semiconductor device in which double guard rings are provided for a NMOS transistor. FIG. 3 is a cross-sectional view in a X-X' cross section of the semiconductor device shown in FIG. 2.

In FIG. 2, the NMOS transistor to be protected has a transistor region 20 including a gate region 30, a drain region 40, and a source region 50. A first (inside) guard ring 610 comprised of a p-type impurity diffusion layer surrounds the transistor region 20, and a second (outside) guard ring 710 comprised of an n-type impurity diffusion layer surrounds the first guard ring 610.

In the conventional semiconductor device shown in FIG. 3, shallow trench isolation (STI) regions 810, 820, and 830 are selectively formed on the surface of the p-type substrate 900 comprised of p-type silicon. Accordingly, the surface of the p-type substrate 900 is divided into a plurality of regions. An n-well 700 is formed to be located between the STI regions 820 and 830.

An n-type impurity diffusion layer 40 that will be a drain region 40 is formed to be located on the right side of the STI region 810 in FIG. 3. A first guard ring 610 (p-type impurity diffusion layer) is formed to be located between the STI regions 810 and 820. A second guard ring 710 (n-type impurity diffusion layer) is formed to be located in the n-well region 700 between the STI regions 820 and 830.

Recently, a transistor structure in which a metal silicide (chemical compound formed by silicon and metal, hereinafter occasionally referred to as silicide as needed) layer is formed on the impurity diffusion layer of a source and a drain of the transistor has been rapidly introduced in the industry. For example, titanium silicide ($TiSi_2$), cobalt silicide ($CoSi_2$) and the like are used as metal silicides. The resistance of the metal silicide is one-tenth or less than that of the impurity diffusion layer. Therefore, it is possible to reduce the parasitic resistance of the source and the drain if the silicide layer is formed in the source region and the drain region. Accordingly, it is possible to enhance the current drive performance of the transistor.

In the manufacturing process of the semiconductor device, this type of silicide is formed not only on the source and the drain but also on the guard ring. For example, U.S. Pat. No. 6,624,487 discloses a transistor structure in which a silicide layer is formed on the entire surface of an impurity diffusion layer that functions as a guard ring. Forming a silicide layer in this way enables an ohmic contact to be obtained with respect to the guard ring.

In the semiconductor device shown in FIG. 3, a silicide layer 42, a silicide layer 620, and a silicide layer 720 are formed to be located immediately on the surface of the n-type impurity diffusion layer 40 that functions as a drain region, the surface of the first guard ring 610, and the surface of the second guard ring 710, respectively. The silicide region 42 (i.e., drain) is connected to the input/output terminal IN/OUT. The silicide region 620 is connected to the ground terminal GND. The silicide region 720 is connected to the power supply terminal VDD.

In the semiconductor device shown in FIG. 3, the silicide layer 720 is formed on the whole surface of the second guard ring 710, as with the invention disclosed in U.S. Pat. No. 6,624,487.

FIG. 4 is a diagram for explaining a latch-up protection mechanism of the conventional semiconductor device.

As shown in FIG. 4, the drain region 40, the first guard ring 610, and the second guard ring 710 of the NMOS transistor to be protected constitutes a parasitic bipolar transistor Q50. They correspond to an emitter, a base, and a collector of the parasitic bipolar transistor Q50, respectively.

The negative trigger current based on the power supply terminal VDD and the ground terminal GND that is generated by latch-up flows as a base current indicated by a current path CP2 and the collector current indicated by a current path CP3. Because of this, the trigger current generated by latch-up does not flow into a PMOS transistor region (not shown in the figure) surrounded by another guard ring. Therefore, the parasitic thyristor is not switched on, and thus the NMOS transistor is protected from latch-up.

In addition, if the transistor shown in FIG. 1 is manufactured by forming a silicide layer on the entire surface of the second (outside) guard ring surrounding the transistor to be protected, as with the conventional semiconductor device, a pn junction located in the vicinity of the second guard ring may be destroyed by the ESD surge applied to the input/output terminal IN/OUT.

For example, as shown in the current path CP1 in FIG. 1, it is ideal for the negative ESD surge applied to the input/output terminal IN/OUT to flow to reach the power supply terminal VDD via the transistors Q30 and Q50 with high voltage resistance. However, if silicide is formed on the entire surface of the second guard ring, it will be difficult for the surge current to flow through the path CP1 shown in FIG. 1. This is because the resistance value of the path CP1 becomes higher, especially when a plurality of protection transistors (Q30 and Q50) are provided in the originally intended path CP1 through which the surge current flows as shown in FIG. 1, and thus it will be relatively easier for the surge current to flow from the power supply terminal VDD toward and into the collector in the parasitic bipolar transistor Q50 including low resistance silicide. In other words, the surge current is supposed to flow from the power supply terminal VDD to a sequential path of the silicide layer 720, the second guard ring 710, the p-type substrate 900, and the n-type impurity diffusion region 40 (i.e., drain). Because of this, the collector side with high calorific value in the parasitic bipolar transistor Q50, that is, the pn junction that is formed by the second guard ring 710 (n-type) and the p-type substrate 900, will be destroyed.

FIG. 5 is a schematic view showing a state in which the pn junction formed by the second guard ring and the p-type substrate 900 is destroyed, and comprised of two portions (a) and (b). The portion (a) shows a cross-section Y-Y' in FIG. 2, and the portion (b) shows an electric connection between the second guard ring 710 and the input/output terminal IN/OUT. If the parasitic bipolar transistor Q50 is locally switched on by the surge current, the surge current from the power supply terminal VDD locally flows into the parasitic bipolar transistor Q50 through the path CP4 because the resistance of silicide is low. As a result, it will be easier for the surge current to be locally concentrated. In particular, current concentrates in the vicinity of the collector of the parasitic bipolar transistor Q50, and accordingly the pn junction will be destroyed. For example, in FIG. 4, an interface portion between the second guard ring 710 and the n-well 700, and an interface portion between the n-well 700 and the p-type substrate 900, will be destroyed.

In view of the above, it will be apparent to those skilled in the art from this disclosure that there exists a need for an improved semiconductor device, and a method of manufacturing the same, in which silicide is formed on a guard ring in order to prevent latch-up, and the guard ring is protected from being destroyed by an ESD surge. This invention addresses this need in the art as well as other needs, which will become apparent to those skilled in the art from this disclosure.

SUMMARY OF THE INVENTION

In order to overcome the above described problem, the semiconductor device in accordance with the present invention comprises a transistor region, a first guard ring, a second guard ring, and a silicide region.

A first-conductive-type transistor is formed in the transistor region. The first guard ring is a second-conductive-type first impurity diffusion layer surrounding the transistor region with a first width, and is coupled to a first reference potential. The second guard ring is a first-conductive-type second impurity diffusion layer surrounding the first guard ring with a second width. The silicide region is formed on the surface of the second guard ring such that substantially no silicide is formed on a portion of the surface of the second guard ring on the side facing a drain region of the first-conductive-type transistor, and is connected to a second reference potential line whose potential is higher than that of the first reference potential line.

In the semiconductor device in accordance with the present invention, a parasitic bipolar transistor constituted by the second guard ring (first-conductive-type second impurity diffusion layer), the first guard ring (second-conductive-type first impurity diffusion layer), and the drain of the first-conductive-type transistor function is formed. Here, they correspond to a collector, a base, and an emitter of the parasitic bipolar transistor, respectively. The silicide region is formed such that substantially no low resistance silicide is formed on the surface of the second guard ring on the side facing the drain region of the first-conductive-type transistor. Therefore, parasitic resistance in the collector is substantially high. Because of this, when the ESD surge is applied from the outside through an input terminal or an output terminal and the parasitic bipolar transistor is switched on, it will be difficult for the surge current to flow through the collector, and accordingly, local concentration of the surge current in the second guard ring will be avoided.

According to the semiconductor device in accordance with the present invention, forming silicide on the surface of the second guard ring enables a good ohmic contact to be obtained, and at the same time as this, the second guard ring is protected from being destroyed when the ESD surge is applied without impairing the latch-up protection function of the second guard ring.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENT

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

A semiconductor device in accordance with the first embodiment of the present invention will be hereinafter explained with reference to FIGS. 6 to 9.

First, a preferred example of implementation of a semiconductor device in accordance with the present embodiment will be explained.

Figure 6:
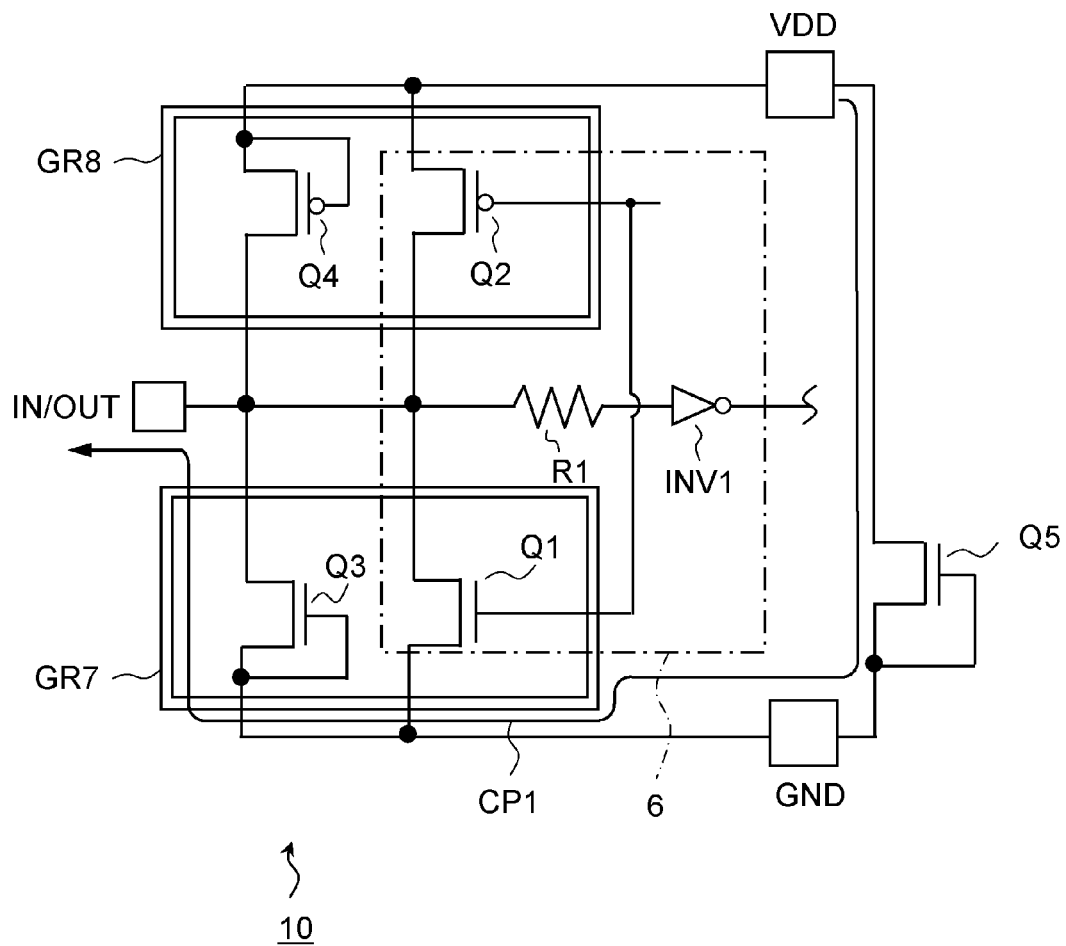
FIG. 6 is a schematic diagram of a semiconductor device involving an ESD protection circuit, in which a semiconductor device in accordance with a first embodiment of the present invention is implemented.

FIG. 6 is a schematic diagram of a semiconductor device 10 (input/output circuit) in which an ESD protection circuit is implemented. A semiconductor device 10 shown in FIG. 6 includes a CMOS input/output circuit 6 and protection transistors Q3, Q4, and Q5. The CMOS input/output circuit 6 is comprised of output transistors Q1 and Q2, a current limiting resistance R1, and an inverter INV1 and receives a gate control signal. On the other hand, the protection transistor Q3, Q4, and Q5 makes use of a snapback operation performed by a parasitic bipolar.

The protection transistor Q5 is an NMOS transistor arranged between a power supply terminal VDD (i.e., second reference potential) and a ground terminal GND (i.e., first reference potential). The protection transistor Q3 is an NMOS transistor arranged between an input/output terminal IN/OUT and the ground terminal GND. The protection transistor Q4 is a PMOS transistor arranged between the input/output terminal IN/OUT and the power supply terminal VDD.

As schematically shown in FIG. 6, a region in which the NMOS transistors Q1 and Q3 are formed is surrounded by double guard rings GR7, and a region in which the PMOS transistors Q2 and Q4 are formed is surrounded by double guard rings GR8.

In the double guard rings GR7 and GR8, a first guard ring functions as a potential fixing layer, and is formed by an impurity diffusion layer whose conductive type is opposite from that of a transistor to be protected. On the other hand, a second guard ring functions as a latch-up protection layer, and is formed by an impurity diffusion layer whose conductive type is the same as that of a transistor to be protected. As shown in FIG. 6, transistors with different conductive types (i.e., NMOS transistors and PMOS transistors) must be provided with double guard rings, respectively.

The structure of the double guard rings will be hereinafter explained.

Figure 1:
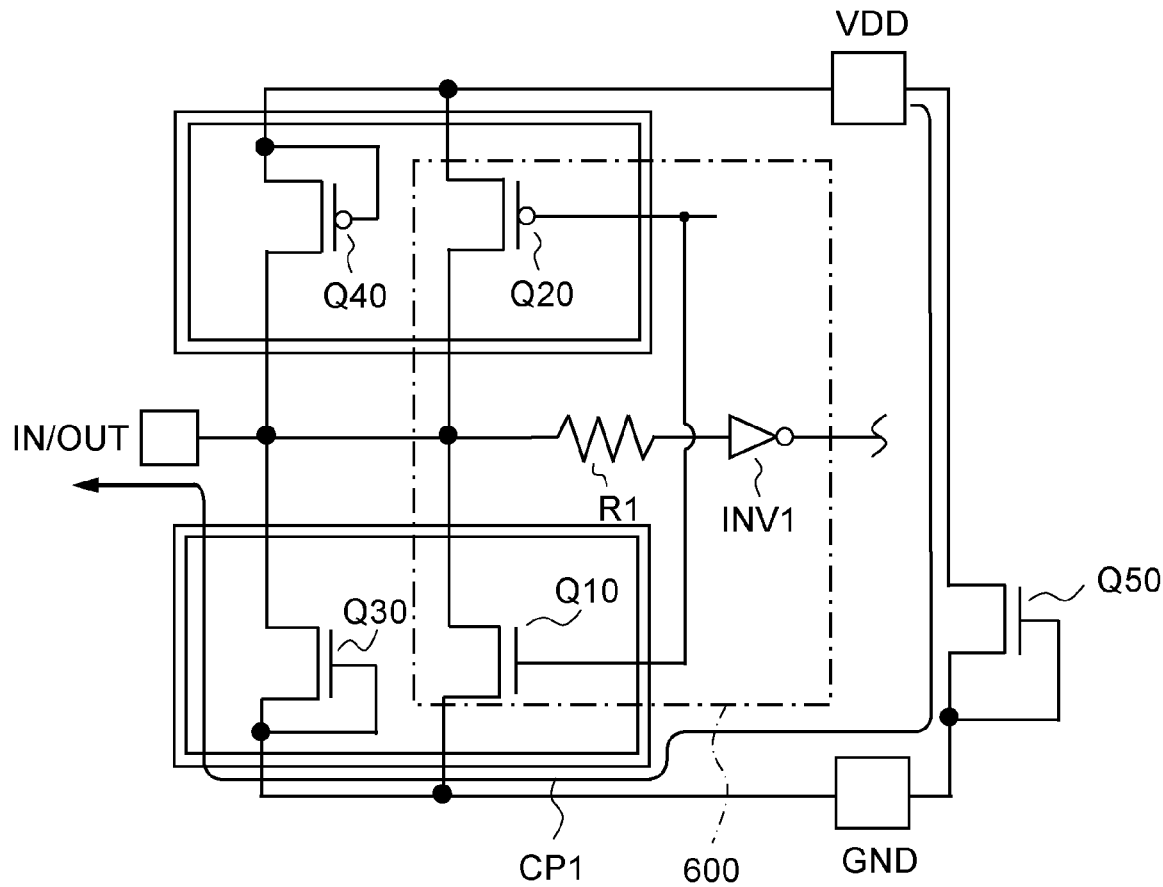
FIG. 1 is a diagram showing an example of a conventional semiconductor device in which an ESD protection circuit is implemented.
Figure 2:
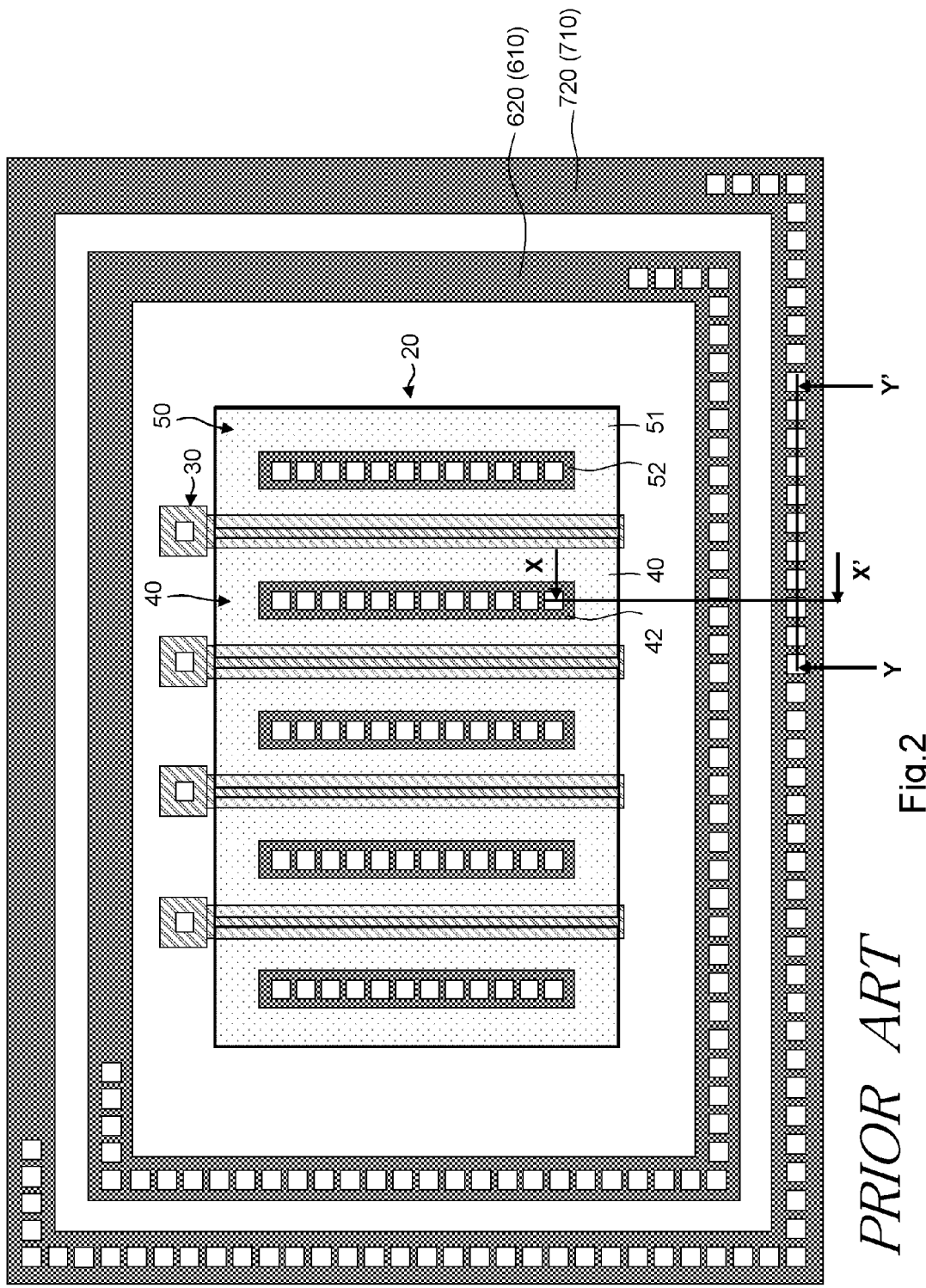
FIG. 2 is a plan view of a conventional semiconductor device in which double guard rings are provided for a NMOS transistor.
Figure 3:
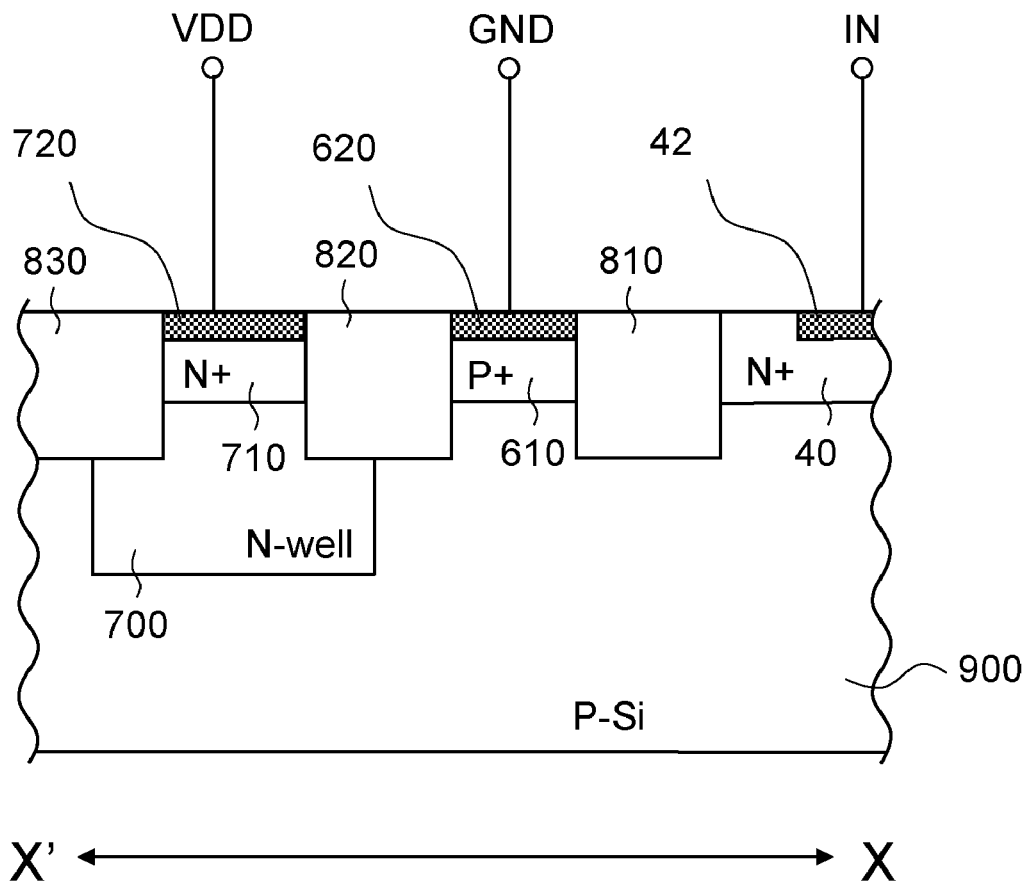
FIG. 3 is a cross-sectional view in a cross section X-X' of the conventional semiconductor device shown in FIG. 2.
Figure 4:
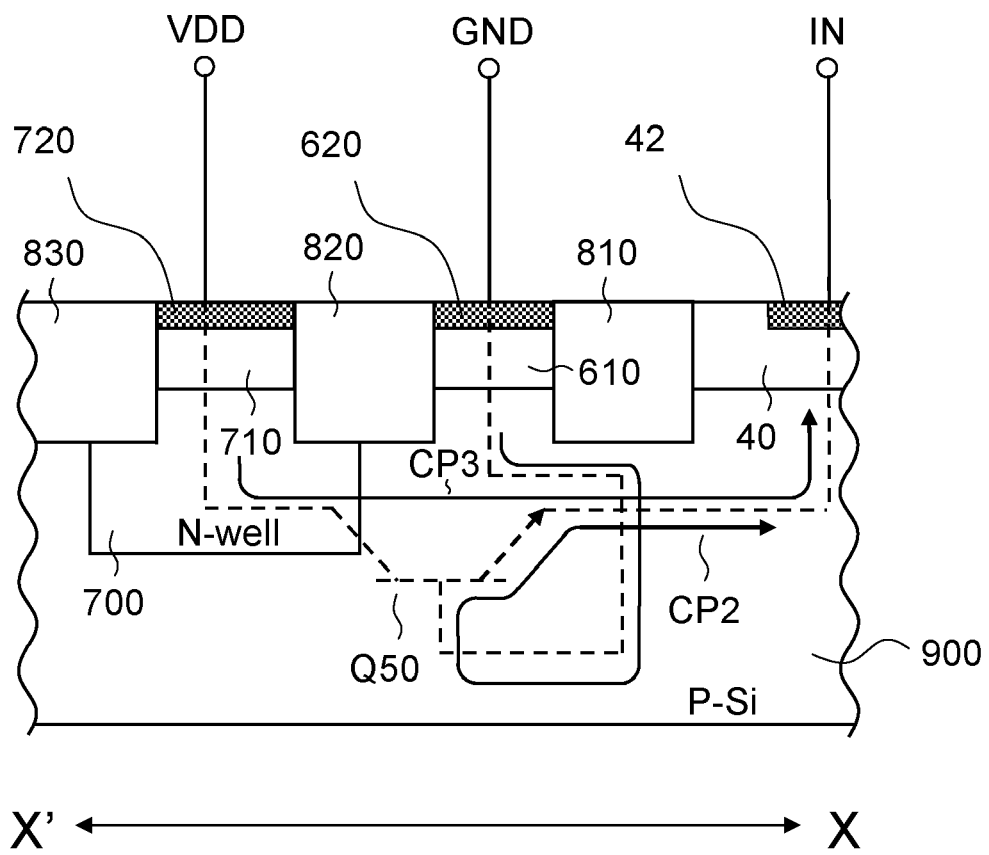
FIG. 4 is a cross-sectional view for explaining the operation of a conventional semiconductor device.
Figure 5:
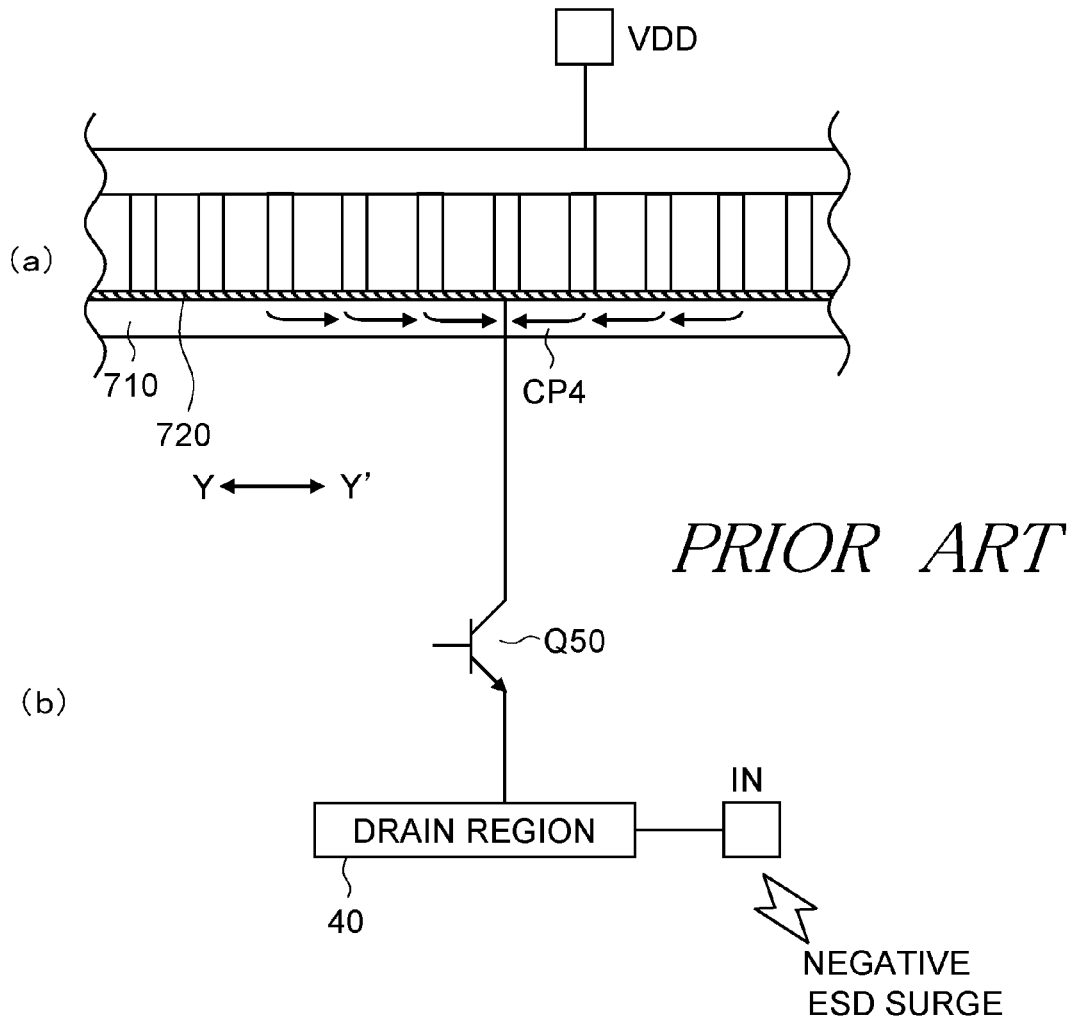
FIG. 5 is a view that is comprised of two portions (a) and (b), and shows a pn junction formed by a second guard ring and a p-type substrate in a state of destruction.

If a negative ESD surge is applied to the input/output terminal IN/OUT in the semiconductor device 10, the ESD surge is absorbed by current that flows through a path CP1 indicated by an arrow in FIG. 1. Thus the CMOS input/output circuit 6 is protected from the surge. Note that the current flowing through the path CP1 sequentially flows the power supply terminal VDD, the NMOS transistor Q5, the ground terminal GND, the NMOS transistor Q3, and the input/output terminal IN/OUT. The protective transistor is designed to withstand a surge voltage (e.g., 2 kV) defined by the human body model (HBM), for instance.

Next, the structures of the NMOS transistors Q1 and Q3 and the double guard rings GR7 surrounding these NMOS transistors in the semiconductor device 10 will be explained with reference to FIGS. 7 and 8. Note that the structures of the PMOS transistors Q2 and Q4 and the double guard rings GR8 surrounding these PMOS transistors are different from those of the following NMOS transistors and double guard rings, in that their conductive types are opposite from each other.

Figure 7:
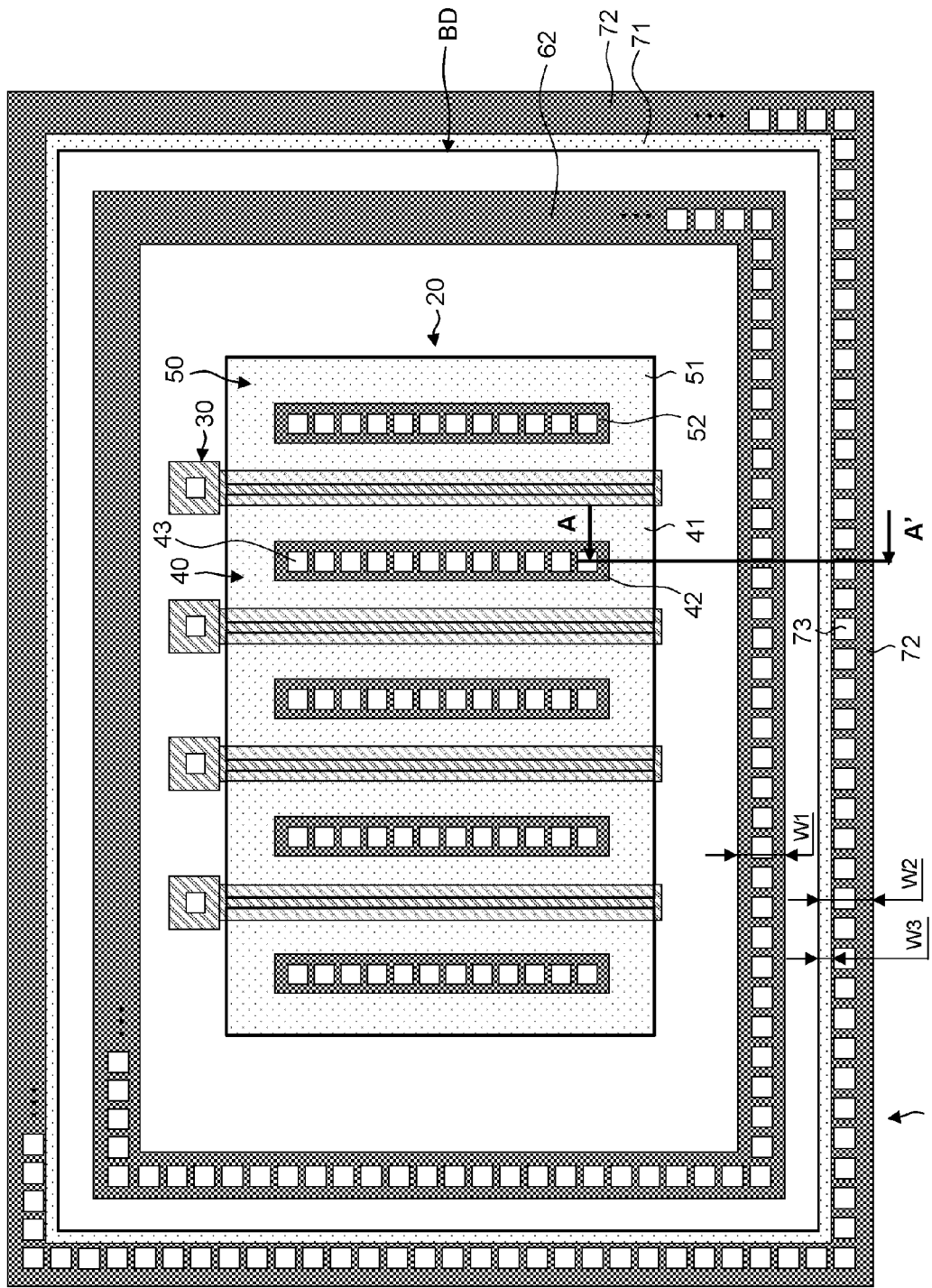
FIG. 7 is a plan view of a semiconductor device in accordance with the first embodiment of the present invention.

FIG. 7 is a plan view of the semiconductor device 10 in accordance with the first embodiment. FIG. 8 is a cross-sectional view of a cross section A-A' of the semiconductor device 10 shown in FIG. 7.

As shown in FIG. 7, an NMOS transistor comprises a transistor region 20 including a gate region 30, a drain region 40, and a source region 50. As shown in FIG. 7, a plurality of the drain regions 40 and a plurality of the source region 50 are alternately formed in the transistor region 20. At the same time as this, the drain regions 40 and the source regions 50 are located to be separated from each other. As shown in FIG. 7, the drain regions 40 and the source regions 50 are formed in a rectangular shape. The longitudinal lengths thereof are the same as each other. The region between the drain regions 40 and the source region 50 functions as a channel region (not shown in the figures). The gate region 30 is formed immediately above the channel region. In addition, one of the drain regions 40, a channel region that contacts the drain region 40, and one of the source regions 50 that contacts the channel region form a NMOS transistor structure. A plurality of contacts are located on the drain region 40 and the source region 50, respectively. The contacts couple the drain region 40 and the source region 50 to a metal conductor that is formed in an upper layer.

Note that the transistor structure is shown in the transistor region in FIG. 7 not as a region only for protecting the two NMOS transistors Q1 and Q3 from the surge, but as a general structure for protecting a plurality of NMOS transistors.

Therefore, it is possible to not only form the NMOS transistor in the specific circuit configuration shown in FIG. 6, but also form all the NMOS transistors whose drains are coupled to the input/output terminal IN/OUT to be surrounded by the guard ring in the semiconductor device.

In the semiconductor device 10, a first guard ring 61 that is comprised of a highly doped p-type impurity diffusion layer having a width W1 (i.e., first width) that surrounds a transistor region 20, and a second guard ring 71 that is comprised of a highly-doped n-type impurity diffusion layer having a width W2 (i.e., second width), surround the first guard ring 61. A silicide layer 62 that is formed on the upper portion of the first guard ring 61, and a silicide layer 72 that is formed on the upper portion of the guard ring 71, are shown in the plan view of FIG. 7. Note that widths W1 and W2 are not necessarily set to be a constant value in the circumferential direction of each of the guard rings.

A plurality of contacts are located on the silicide layer 62 and the silicide layer 72, respectively, and couple the silicide layer 62 and the silicide layer 72 to a metal conductor formed on an upper layer.

Figure 8:
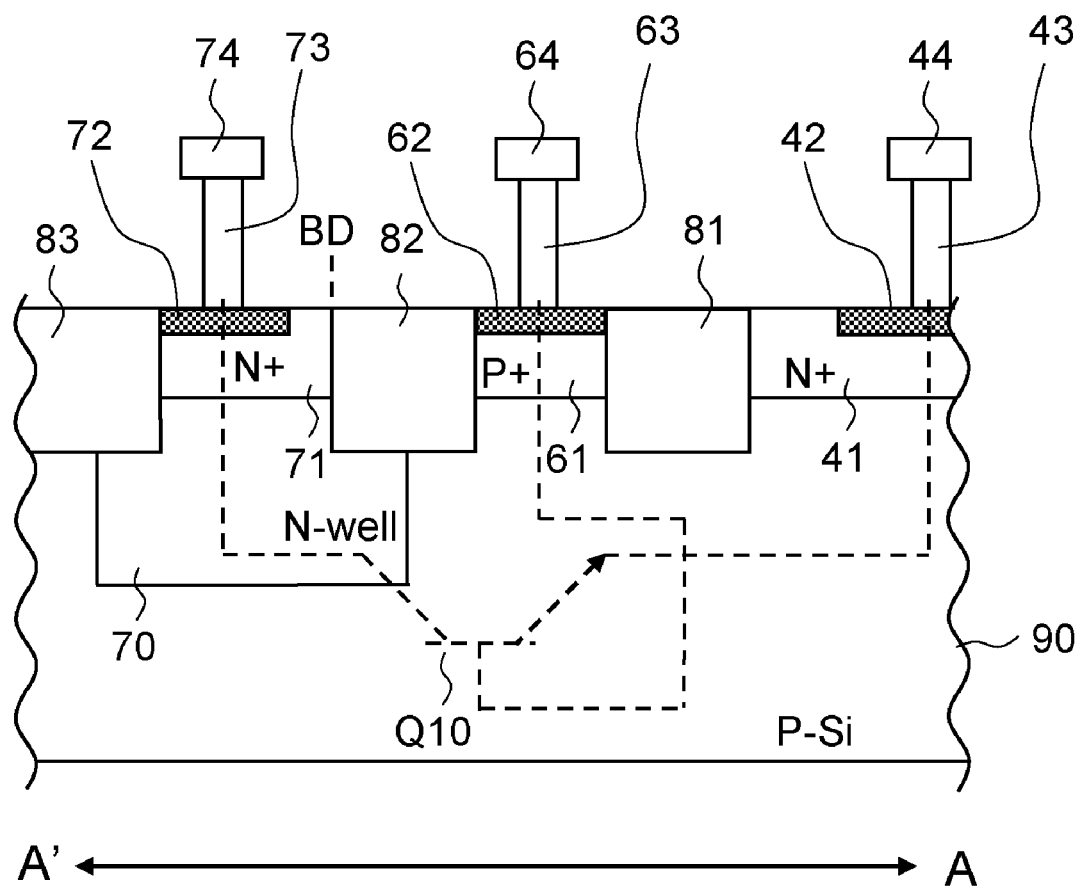
FIG. 8 is a cross-sectional view in a cross section A-A' of the semiconductor device shown in FIG. 7.

FIG. 8 shows a cross-sectional view of a cross-section A-A' of the semiconductor device 10 shown in FIG. 7.

Shallow trench isolation (STI) regions 81, 82, and 83 are selectively formed on the surface of a p-type substrate 90 comprised of p-type silicon. Thus, the surface of the p-type substrate 90 is divided into a plurality of regions. An n-well 70 is formed to be arranged between the STI region 82 and the STI region 83.

As shown in FIG. 8, an n-type impurity diffusion layer 41, which will be the drain region 40 in a following step, is formed on the right side of the STI region 81. The first guard ring 61 (p-type impurity diffusion layer) is formed to be arranged between the STI region 81 and the STI region 82. The second guard ring 71 (n-type impurity diffusion layer) is formed to be arranged in the n-well region 70 between the STI region 82 and the STI region 83.

A silicide layer 42 is formed on the surface of the n-type impurity diffusion layer 41 that functions as a drain region. The silicide layer 62 is formed on the surface of the first guard ring 61. The silicide layer 72 is formed on the surface of the second guard ring 71.

A heretofore known silicide technique by which a silicide layer is formed to be self-aligned may be used as a method configured to form the silicide layer.

For example, the following forming steps are performed in order to form cobalt silicide on a impurity diffusion layer. First, a cobalt film is formed on the surface of a silicon substrate in which an impurity diffusion layer is formed by means of sputtering. Then, rapid thermal annealing (RTA) is performed at approximately 450 to 650 Celsius degree, for instance. Because of this, the surface of the impurity diffusion layer and a portion of the Co film contacting the surface thereof chemically react with each other. Accordingly, a $CoSi_2$ layer is formed on the impurity diffusion layer.

As described below, in the semiconductor device 10 in accordance with the present embodiment, a silicide film is formed after the impurity diffusion layer is covered with a nitride film (or an oxide film) functioning as a mask in order to form the silicide layer in a desired position on the impurity diffusion layer.

A contact 43 is formed on the surface of the silicide layer 42, and connected to a metal conductor 44. A contact 63 is formed on the surface of the silicide layer 62, and connected to a metal conductor 64. A contact 73 is formed on the surface of the silicide layer 72, and connected to a metal conductor 74.

The n-type impurity diffusion layer 41 that will be a drain, the first guard ring 61, and the second guard ring 71 are coupled to the input/output terminal IN/OUT, the ground terminal GND (i.e., first reference potential), and the power supply terminal VDD (i.e., second reference potential) through the metal conductors 44, 64, and 74, respectively.

As shown in FIGS. 7 and 8, in the semiconductor device 10 in accordance with the present embodiment, silicide is not formed to cover the whole surface of the second guard ring 71, but formed to cover the surface of the remaining portion excluding a portion of the second guard ring 71 located on the side facing the transistor region 20 (i.e., the side of the n-type impurity diffusion layer 41 shown in FIG. 8). In order to understand this easily, a junction interface BD (see FIG. 8) between the second guard ring 71 and the STI region 82 is shown in the plan view of FIG. 7. In the configuration shown in FIG. 7, silicide is not formed on a portion of the second guard ring 71 with a width W3 (i.e., predetermined third width) on the side facing the transistor region 20 in the circumferential direction.

Next, an operation of the semiconductor device 10 in accordance with the present embodiment will be hereinafter explained.

As shown in FIG. 8, the drain (n-type impurity diffusion layer 41), the first guard ring 61 (p-type impurity diffusion layer), the second guard ring 71 (n-type impurity diffusion layer) constitute a parasitic npn bipolar transistor Q10. They correspond to an emitter, a base, and a collector of the parasitic npn bipolar transistor Q10, respectively. Therefore, in the example of the semiconductor device shown in FIG. 6, the parasitic npn bipolar transistor Q10 will be switched on when the negative ESD surge is applied to the input/output terminal IN/OUT.

When the parasitic npn bipolar transistor Q10 is switched on, excessive ESD surge current sequentially flows through the silicide layer 72, the second guard ring 71, the n-well 70, the p-type substrate 90, and the drain (n-type impurity diffusion layer 41). In general, a pn junction of a collector with high calorific value will be a portion that is the most easily destroyed by the surge current.

Resistance of silicide is one-tenth or less than that of the n-type impurity diffusion layer that will be the second guard ring 71. Therefore, excessive ESD surge is easily generated. However, in the semiconductor device 10 in accordance with the present embodiment, silicide is configured not to be formed on the whole portion of the surface of the second guard ring 71 on the side facing the transistor region 20. Therefore, it is difficult for the ESD surge to locally concentrate on the pn junction of the collector in the parasitic bipolar transistor Q10.

In other words, low resistance silicide is configured not to be formed on the whole portion on the side facing the transistor region 20. Therefore, when the parasitic bipolar transistor Q10 is switched on by the ESD surge, the collector resistance in the parasitic bipolar transistor Q10 substantially increases. Accordingly, it will be difficult for the surge current to flow. Therefore, it is difficult for the ESD surge current to locally concentrate.

In addition, if it is difficult for the surge current from the power supply terminal VDD to flow through the collector in the parasitic bipolar transistor Q10, it will be easy for the surge current to follow through the originally intended current oath CP1 (see FIG. 6).

As described above, the silicide layer 72 is formed in the semiconductor device 10 in accordance with the present embodiment such that local concentration of the ESD surge is not caused. Therefore, the second guard ring of the NMOS transistor (NMOS transistors Q1 and Q3 in FIG. 6) whose drain is coupled to the input/output terminal IN/OUT is protected from the ESD surge. Thus, the original function, that is, latch-up protection, is not impaired.

In addition, as shown in FIG. 7, in the semiconductor device 10 in accordance with the present embodiment, even if silicide is not formed in a portion of the surface of the second guard ring 71, silicide is formed in the position in which a contact is formed. Therefore, an ohmic contact is formed between the second guard ring 71 and the contact 73. In general, a second guard ring located outside a first guard ring is often formed to have a large width such that it is allowed to effectively absorb trigger current by latch-up. Therefore, it is possible to form the silicide region located on the second guard ring to have a narrower width while silicide is formed in the position in which a contact is formed without having a great impact on the peripheral layout design.

Only covering the portion on the second guard ring in which silicide is not formed with a mask enables the silicide region in the semiconductor device 10 in accordance with the present embodiment to be formed, and a change in the manufacturing process is not necessary.

Figure 9:
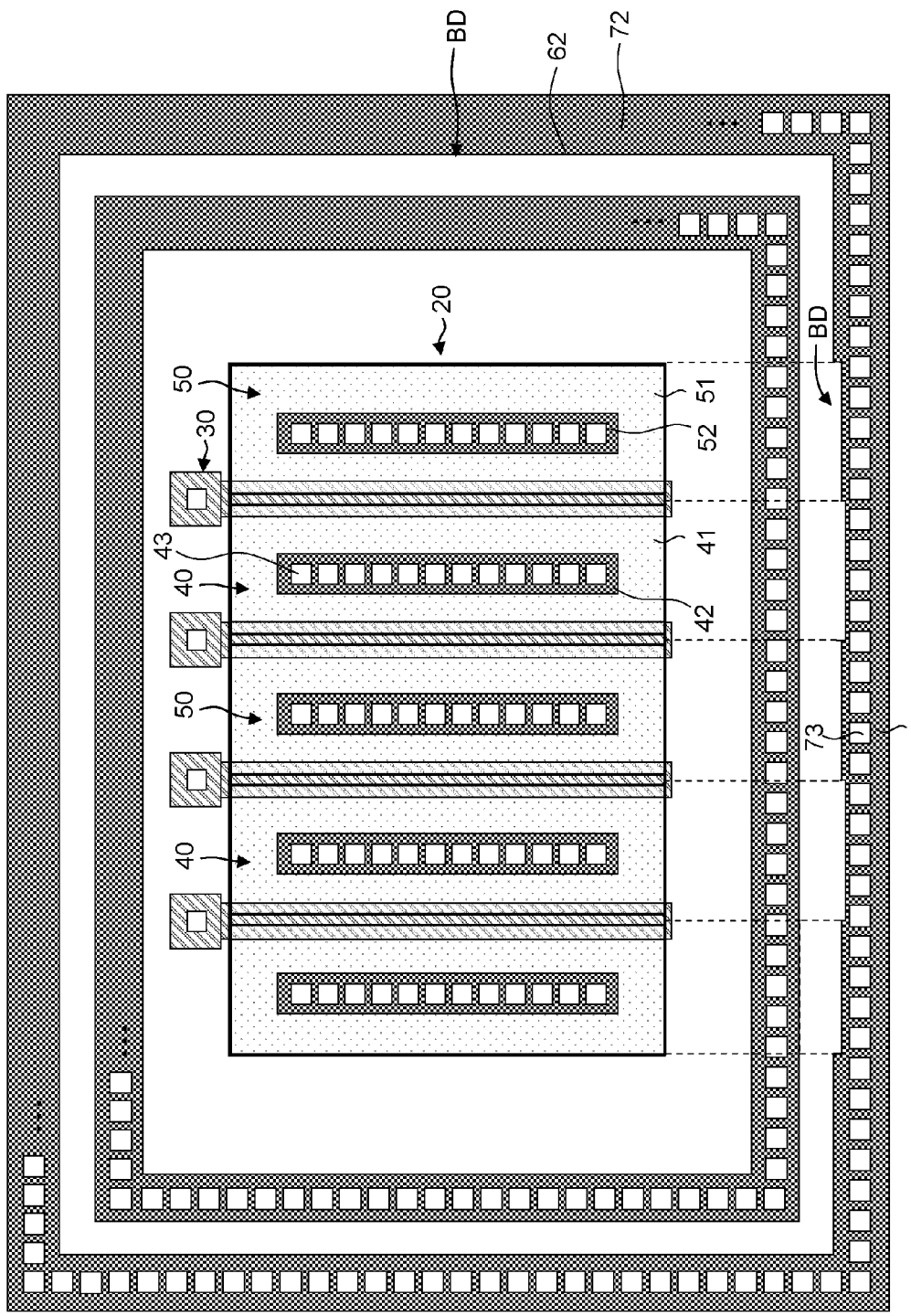
FIG. 9 is a plan view of a modification of the semiconductor device in accordance with the first embodiment of the present invention.

Note that as shown in FIG. 7, the semiconductor device 10 is configured to have a structure in which silicide is not formed on the portion of the second guard ring 71 with a width W3 (i.e., predetermined third width) on the side facing the transistor region 20 in the circumferential direction. However, the structure of the semiconductor device 10 is not limited to this configuration. That is, silicide may not be formed on the side facing the transistor region 20, and the width of the region in which silicide is not formed may not be constant. For example, as shown in FIG. 9, it is possible to form the width of the non-silicide region on the second guard ring 71 so that width of the portion of the non-silicide region facing the drain region 40 of the transistor region 20 and that of the portion of the non-silicide region facing the source region 50 of the transistor region 20 are different from each other. In this case, as shown in FIG. 9, it is desirable to set the width of the non-silicide region on the portion of the second guard ring 71 facing the drain region to be large.

In addition, the ESD surge current (the collector current of the parasitic bipolar transistor) flows from the second guard ring 71 to the drain region 40. Therefore, it will be possible to prevent local concentration of the ESD surge if silicide is not formed at least only in the area of the second guard ring 71 facing the drain region 40 in the circumferential direction.

Second Embodiment

A semiconductor device in accordance with the second embodiment of the present invention will be hereinafter explained in detail with reference to FIGS. 10 to 12. Note that the same numerals and symbols are given to portions that are the same as those in the semiconductor device in accordance with the first embodiment, and those explanations will be hereinafter omitted.

As described above, in the semiconductor device 10 in accordance with the first embodiment, silicide is not formed on the side facing the transistor region 20. Thus, compared to the conventional art, there is less possibility that local concentration of the surge current is caused. The semiconductor device 11 in accordance with the present embodiment is configured to have a structure for more reliably preventing the local concentration of the surge current from being caused.

First, the structure of the semiconductor device 11 in accordance with the present embodiment will be explained.

Figure 10:
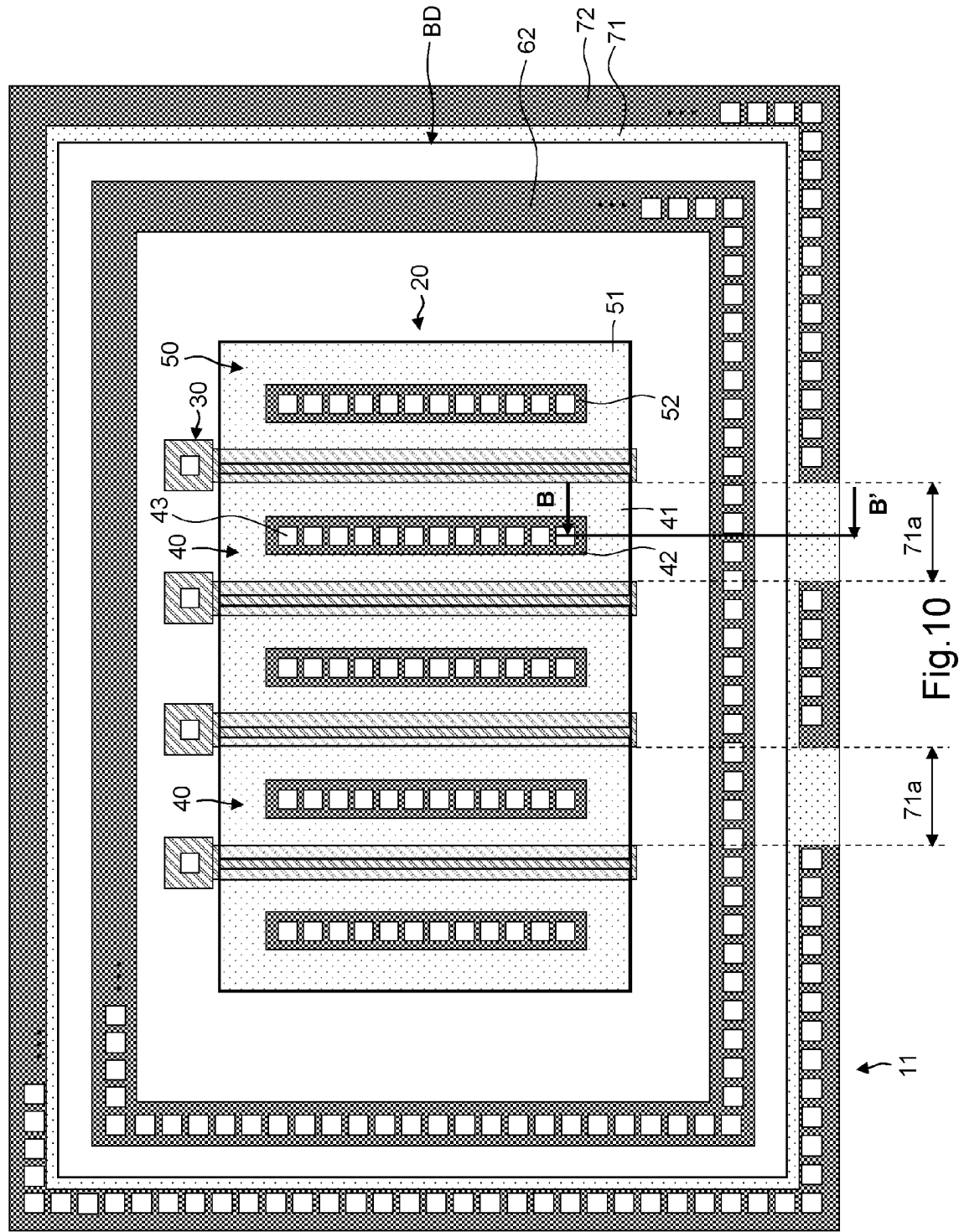
FIG. 10 is a plan view of a semiconductor device in accordance with a second embodiment of the present invention.

FIG. 10 is a plan view of the semiconductor device 11 in accordance with the second embodiment. FIG. 11 is a cross-sectional view of a cross section B-B' of the semiconductor device 11 shown in FIG. 10.

As described in FIG. 10, in the semiconductor device 11 in accordance with the present embodiment, silicide is not formed to cover the whole surface of the second guard ring 71 but formed to cover the remaining portion excluding the portion with the width W3 (i.e., predetermined third width) of the surface of the second guard ring 71 on the side facing the transistor region 20 (i.e., the side of the n-type impurity diffusion layer 41). This configuration is the same as that of the semiconductor device 10 in accordance with the first embodiment.

In the semiconductor device 11 in accordance with the present embodiment, in addition to the above described structure of the semiconductor device 10, silicide is configured not to be formed on a portion with a width W2 (i.e., second width) of the second guard ring 71 in an area 71a that is close to the drain region 40 in the circumferential direction. In addition, as shown in FIG. 11, it is desirable that substantially no contacts to a metal conductor located in an upper layer are formed on the surface of the second guard ring 71 in the area 71a.

Figure 11:
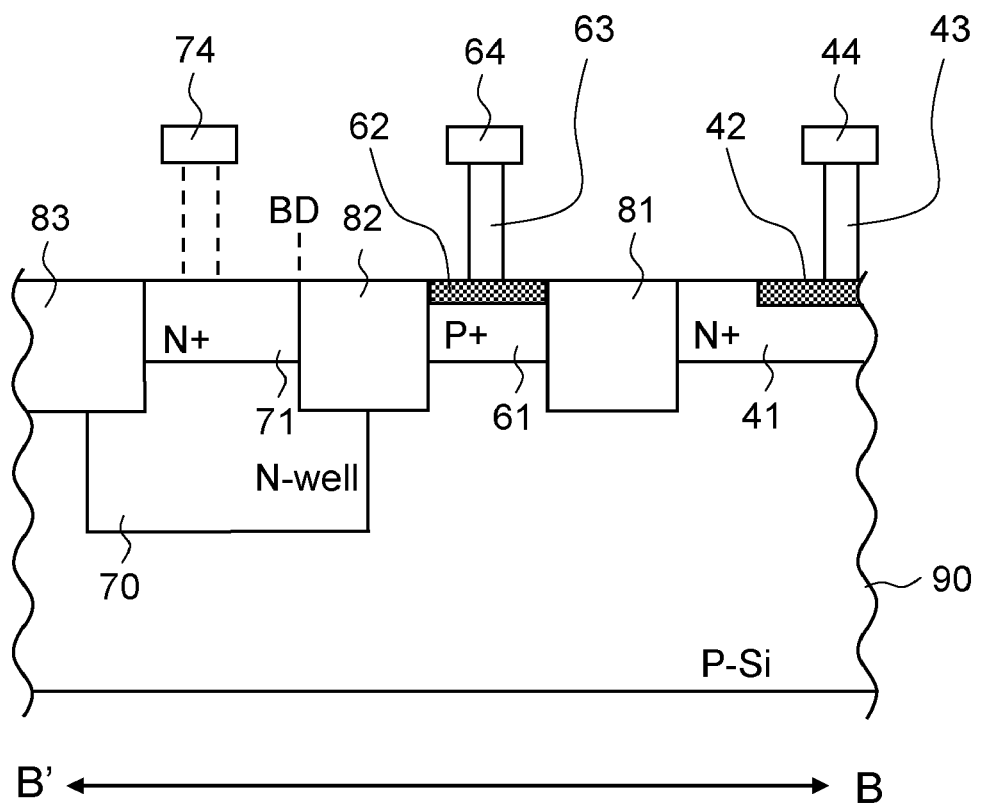
FIG. 11 is a cross-sectional view in a cross-section B-B' of the semiconductor device shown in FIG. 10.
Figure 12:
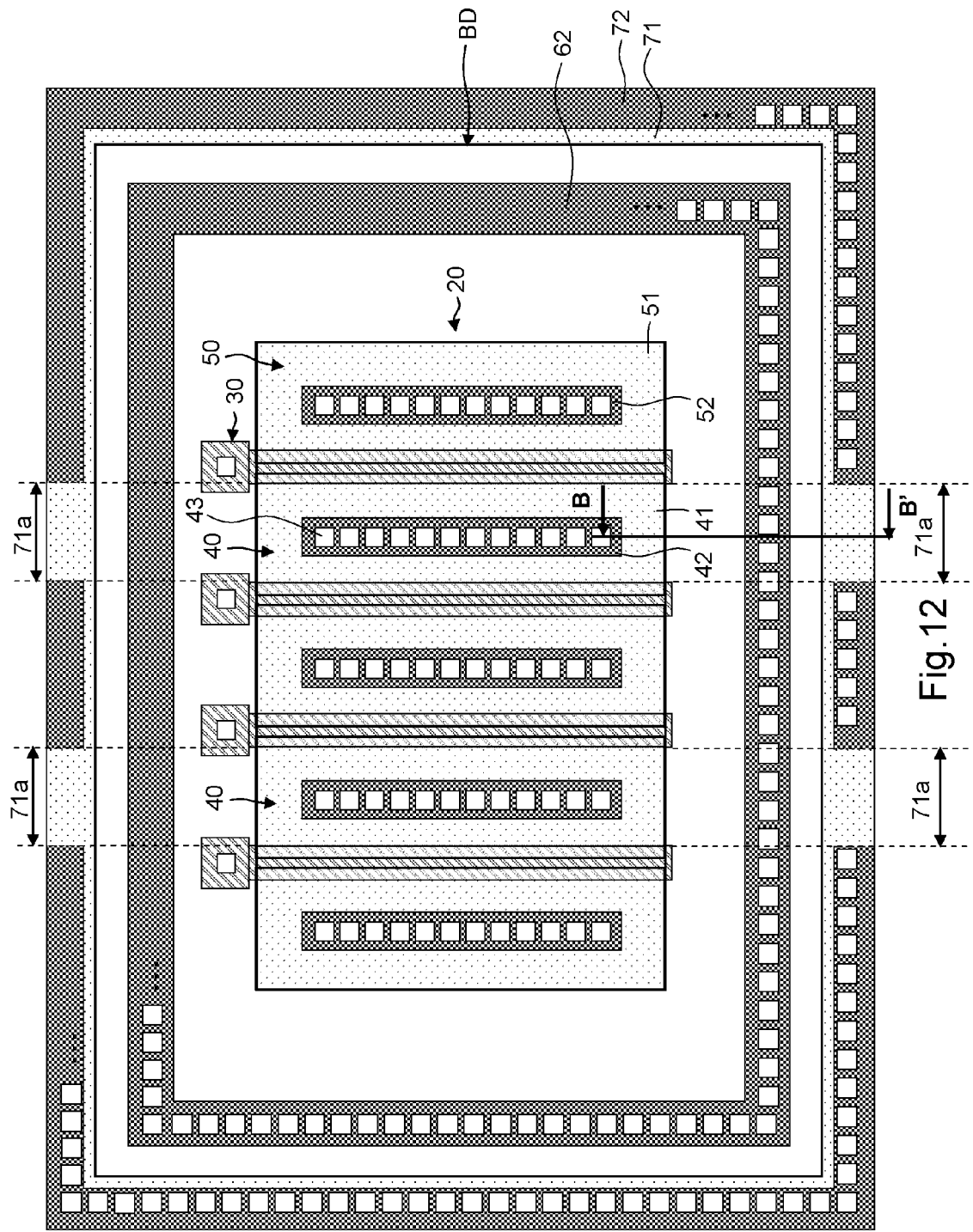
FIG. 12 is a plan view of a modification of the semiconductor device in accordance with the second embodiment of the present invention.

In FIG. 11, a parasitic npn bipolar transistor constituted by a drain (n-type impurity diffusion layer 41), a first guard ring 61 (p-type impurity diffusion layer), a second guard ring 71 (n-type impurity diffusion layer) is formed. Here, they correspond to an emitter, a base, and a collector of the parasitic npn bipolar transistor, respectively. This configuration is the same as that in the semiconductor device 10 in accordance with the first embodiment.

As described above, in the semiconductor device 10 in accordance with the first embodiment, when the parasitic npn bipolar transistor is switched on, the excessive ESD surge current flows through the following sequential path comprised of a silicide layer 72, a second guard ring 71, an n-well 70, a p-type substrate 90, and a drain (n-type impurity diffusion layer 41). When seen in the plan view of FIG. 10, the surge current flows in a direction perpendicular to the circumferential direction of the second guard ring 71 (n-type impurity diffusion layer). However, it does not necessarily uniformly flow regardless of the position in the circumferential direction. In other words, when seen in the plan view, the region in which the base width of the parasitic bipolar transistor is formed to be narrow, that is, the area close to the drain region 40, will be a portion in which the current amplification factor of the parasitic bipolar transistor will increase, and thus local concentration of the surge current is easily caused in the semiconductor device 10 in accordance with the above described first embodiment.

In consideration of the above, as shown in FIG. 10, the semiconductor device 11 in accordance with the second embodiment is configured to have a structure in which silicide is not formed on the portion with the full width (i.e., width W2) of the second guard ring 71 in the region 71a that is close to the drain region 40. Therefore, it is possible to reliably prevent the local concentration of the surge current. It is preferable to configure a structure in which substantially no contacts are arranged in the region in which silicide is not formed because the surge current path is blocked.

In addition, the structure of the semiconductor device 11 makes it difficult for the surge current from the power supply terminal VDD to flow through the collector of the parasitic bipolar transistor Q10. Accordingly, it will be easy for the surge current to flow through the originally intended current path CP1 (see FIG. 6).

Note that as shown in FIG. 10, the ratio of the area 71a in which silicide is not formed in the whole surface of the second guard ring 71 is small, and the n-type impurity diffusion layer is not impaired. Therefore, the structure has little impact on the latch-up protection function.

As described above, the semiconductor device in accordance with the present embodiment is configured to have a structure in which silicide is not formed on a portion with full width (i.e., second width) of the second guard ring 71 (second impurity diffusion layer) in the area that is close to the drain region of the NMOS transistor (first-conductive-type transistor) in the circumferential direction. Therefore, the second guard ring 71 of the NMOS transistor is protected from the ESD surge, and the latch-up protection function by the guard ring is ensured.

Note that in the structure of the semiconductor device 11 shown in FIG. 10, the silicide layer 72 is formed so that silicide is not formed in the area 71a located in the opposite side from the gate electrode in the gate region 30. However, the structure of the semiconductor device 11 is not limited to this configuration. As shown in FIG. 12, the region 71a in which silicide is not formed also may be provided regardless of the direction of the gate electrode.

Third Embodiment

A semiconductor device in accordance with the third embodiment of the present invention will be hereinafter explained with reference to FIGS. 13 to 16. Note that the same numerals and symbols are given to the portions that are the same as those in the semiconductor device in accordance with the first embodiment, and those explanations will be hereinafter omitted.

As described above, in the semiconductor device 10 in accordance with the first embodiment, silicide is not formed on the side facing the transistor region 20. Therefore, it is difficult for local concentration of the surge current to be caused, compared to the conventional art. However, the semiconductor device 12 in accordance with the present embodiment is configured to have a structure for reliably preventing local concentration of the surge current from being caused.

First, the structure of the semiconductor device 12 in accordance with the present embodiment will be explained in detail.

Figure 13:
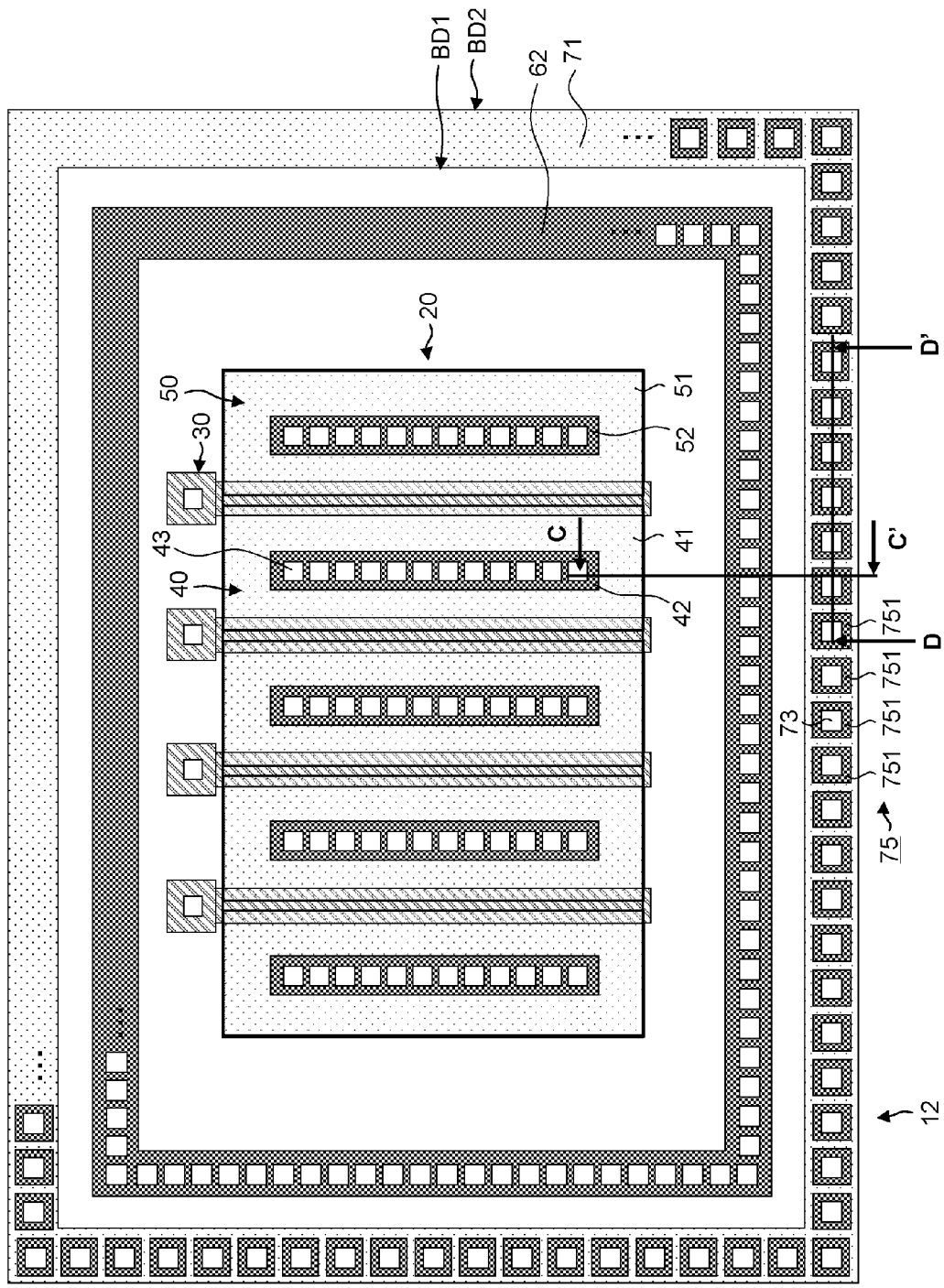
FIG. 13 is a plan view of a semiconductor device in accordance with a third embodiment of the present invention.
Figure 14:
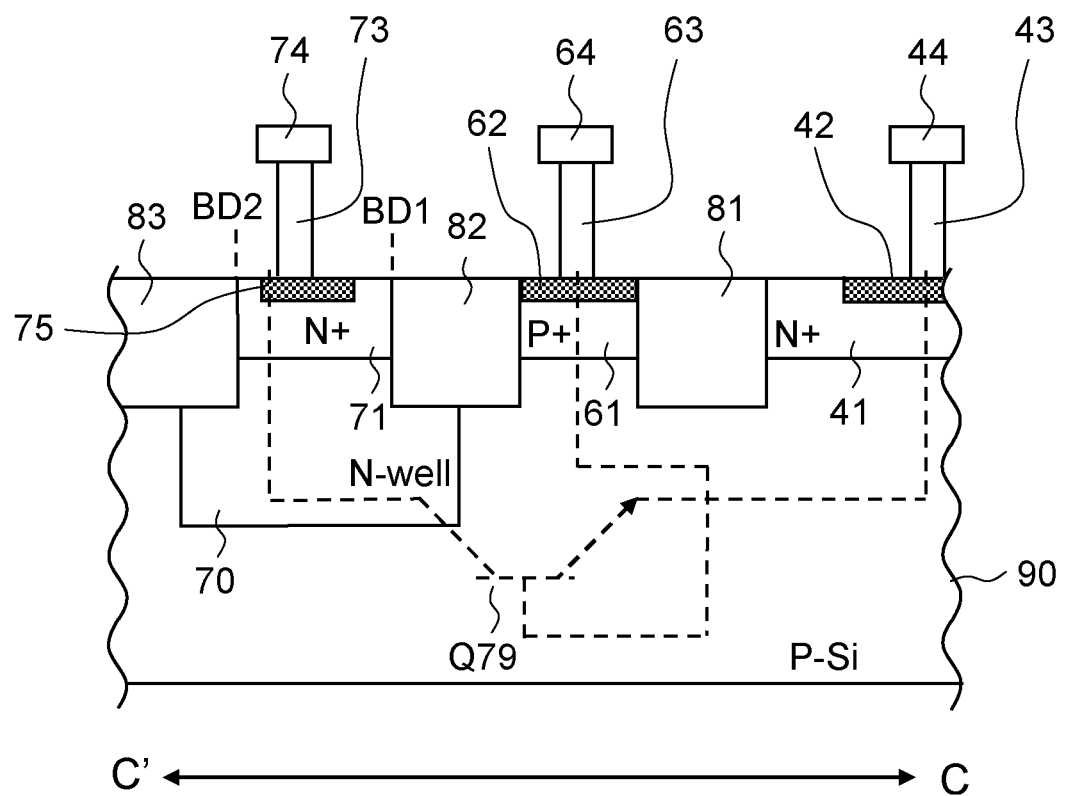
FIG. 14 is a cross-sectional view in a cross section C-C' of the semiconductor device shown in FIG. 13.

FIG. 13 is a plan view of the semiconductor device 12 in accordance with the third embodiment. FIG. 14 is a cross-sectional view of a cross section C-C' of the semiconductor device 12 shown in FIG. 13.

As shown in FIG. 13, in the semiconductor device 12 in accordance with the present embodiment, a silicide region 75 is formed on the surface of the second guard ring 71. The silicide region 75 includes a plurality of sub-regions 751 (small divided portions of the silicide region), and a contact is formed immediately above the plurality of sub-regions 751, respectively. The plurality of sub-regions 751 are formed to be separated from each other. Because of this, the sub-regions 751 are in a state that they are electrically coupled to each other with high resistance through the n-type impurity diffusion layer.

Note that in FIG. 14, the silicide region 75 is configured to have a structure in which silicide is not formed on the surface of the second guard ring 71 in both sides of the STI regions 82 and 83. However, the structure of the silicide region 75 is not limited to this configuration. Silicide may be formed on the surface of the second guard ring 71 to reach a position of a junction interface BD2 (i.e., junction interface between the second guard ring 71 and the STI region 83) on the STI 83 side of the surface of the second guard ring 71 that is not easily destroyed by the surge current, while a state that the plurality of sub-regions 751 are formed to be separated from each other is maintained.

Next, an operation of the semiconductor device 12 in accordance with the present embodiment will be explained with reference to FIG. 15.

Figure 15:
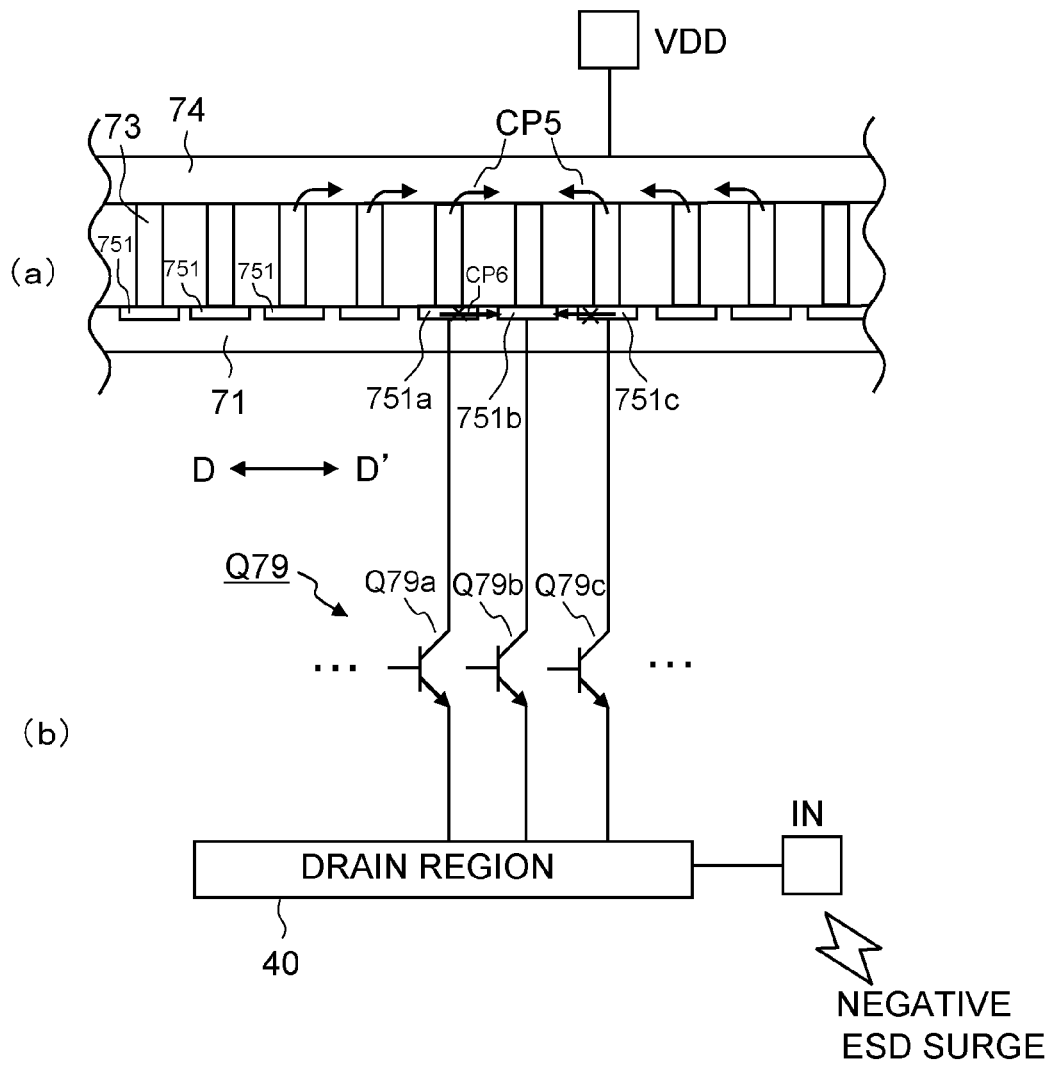
FIG. 15 is a diagram that is comprised of two portions (a) and (b), and explains the operation of a semiconductor device in accordance with a third embodiment of the present invention.

FIG. 15 is a diagram for explaining an operation of the semiconductor device 12, and includes two portions (a) and (b). The portion (a) is a cross section D-D' of the semiconductor device 12 shown in FIG. 13. On the other hand, the portion (b) shows electrical connection between the second guard ring 71 and the input/output terminal IN/OUT. A transistor Q79 shown in the portion (b) of FIG. 15 is a parasitic npn bipolar transistor constituted by the drain (n-type impurity diffusion layer 41), the first guard ring 61 (p-type impurity diffusion layer), and the second guard ring 71 (n-type impurity diffusion layer). Here, they correspond to an emitter, a base, and a collector of the parasitic npn bipolar transistor, respectively.

Here, in the structure of the semiconductor device 12, the plurality of sub-regions 751 are coupled to each other with high resistance. Therefore, as shown in FIG. 15, it is possible to consider that the parasitic bipolar transistor Q79 is comprised of a plurality of parasitic transistors in which a collector is coupled to each of the plurality of sub-regions 751. In FIG. 15, for instance, it is possible to consider that a sub-region 751a, a sub-region 751b, and a sub-region 751c are coupled to collectors of parasitic transistors Q79a, Q79b, and Q79c, respectively.

Then, according to application of the negative ESD surge with respect to the input/output terminal IN/OUT, when the parasitic transistor Q79b is switched on as a parasitic transistor which has a low operational threshold and easily starts performing a bipolar operation in the plurality of parasitic transistors Q79a, Q79b, Q79c . . . , for instance, the collector potential of the parasitic transistor Q79b is attracted to the emitter potential, and thus it becomes low potential. In other words, the sub-region 751b will have a low potential. Accordingly, the surge current will intensively flow into the sub-region 751b whose potential is decreased to be low from the periphery of the sub-region 751b.

In the semiconductor device 12 in accordance with the present embodiment, adjacent sub-regions 751 are coupled to each other with high resistance. Therefore, the path of the surge current flowing toward the sub-region 751b from the periphery thereof is not a current path CP6 but a current path CP5 shown in FIG. 15. In other words, the surge current that flows into the sub-region 751b from the periphery thereof flows into the sub-regions 751b through the contact 73 and the metal conductor 74. Therefore, silicide regions 751a and 751c located around the sub-region 751b, and corresponding contacts function as collector resistances, and local concentration of the surge current with respect to the pn junction located in the vicinity of the sub-region 751b will be inhibited. In other words, the surge current from the periphery of the sub-region 751b flows toward the metal conductor located in the above layer. Accordingly, it will be difficult for local concentration of the surge current in the sub-region 751b to be caused.

As described above, in the semiconductor device in accordance with the present embodiment, the silicide region 75 includes the plurality of sub-regions 751 formed to be separated from each other, and each of the sub-regions 751 is coupled to the metal conductor 74. Therefore, a planar current path of the surge current among the sub-regions 751 is blocked. Because of this, it will be difficult for local concentration of the surge current to be caused in the sub-regions 751. Therefore, the second guard ring of the NMOS transistor is protected from the ESD surge, and the latch-up protection function by the guard ring will be ensured.

In addition, the structure of the semiconductor device 12 makes it difficult for the surge current from the power supply terminal VDD to flow through the collector of the parasitic bipolar transistor Q79. Therefore, it makes it easy for the surge current to flow through the originally intended current path CP1 (see FIG. 6).

Figure 16:
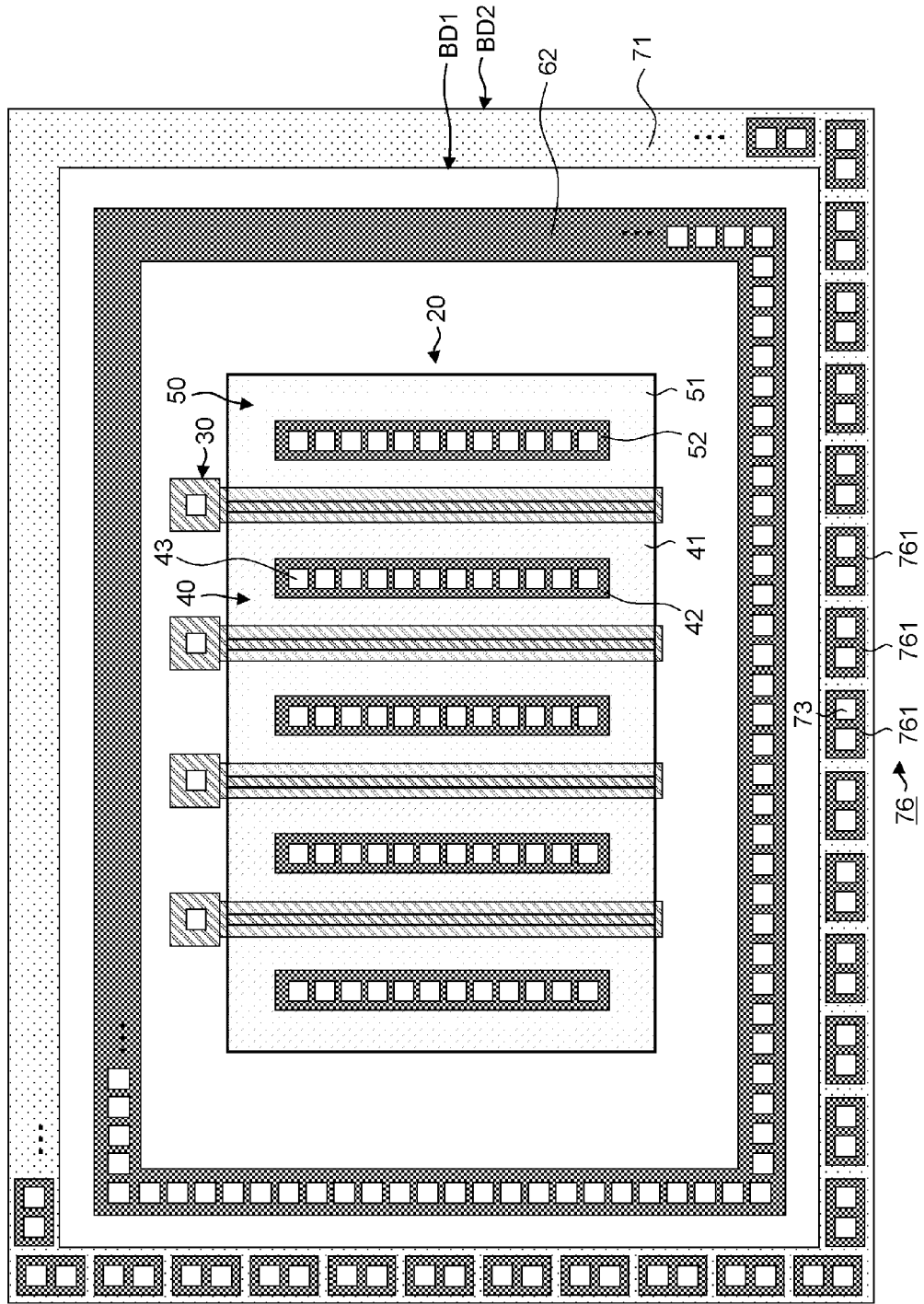
FIG. 16 is a plan view of a modification of the semiconductor device in accordance with the third embodiment of the present invention.

Note that as shown in FIG. 13, the semiconductor device in accordance with the present embodiment is configured to have a structure in which a single contact is formed on each of the plurality of sub-regions 751. However, the structure of the semiconductor device is not limited to this structure. For example, as shown in FIG. 16, a plurality of contacts (two contacts in an example shown in FIG. 16) may be formed on each of the sub-regions 761.

In addition, as described above, local concentration of the surge current is easily caused in the area that is close to the drain region 40 (i.e., the area 79a shown in FIG. 10) because the current amplification factor of the parasitic bipolar transistor is increased in the area. Therefore, the above described structure (i.e., the structure comprised of a plurality of sub-regions that are isolated from each other) may be formed only in this area.

As described above, the embodiments of the present invention have been described in detail. Specific structure and system are not limited to the embodiments of the present invention, and design changes and application to other systems may be performed within the scope of the content of the present invention.

General Interpretation of Terms

In understanding the scope of the present invention, the term "configured" as used herein to describe a component, section or part of a device includes hardware and/or software that is constructed and/or programmed to carry out the desired function. In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applied to words having similar meanings such as the terms, "including," "having," and their derivatives. Also, the term "part," "section," "portion," "member," or "element" when used in the singular can have the dual meaning of a single part or a plurality of parts. Finally, terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A semiconductor device, comprising:
    a transistor region in which a first-conductive-type transistor is formed;
    a first guard ring that is a second-conductive type first impurity diffusion layer surrounding the transistor region and having a first width, the first guard ring coupled to a first reference potential line;
    a second guard ring that is a first-conductive-type second impurity diffusion layer surrounding the first guard ring and having a second width; and
    a silicide region disposed on a surface of the second guard ring such that substantially no silicide extends along an entire circumference of the surface of the second guard ring on a side facing a drain region of the first-conductive-type transistor, the silicide region connected to a second reference potential line, the second reference potential line having a potential higher than a potential of the first reference potential line.

2. The semiconductor device according to claim 1, wherein the portion of the surface of the second guard ring on which substantially no suicide is formed is configured to have a predetermined third width in a circumferential direction.

3. The semiconductor device according to claim 1, wherein substantially no silicide is formed on a portion with the second width of the surface of the second guard ring in an area close to the drain region of the first-conductive-type transistor.

4. The semiconductor device according to claim 1, wherein substantially no contact to a metal conductor is formed on the second guard ring in an area close to the drain region of the first-conductive-type transistor.

5. The semiconductor device according to claim 3, wherein substantially no contact to a metal conductor is formed oh the second guard ring in an area close to the drain region of the first-conductive-type transistor.

6. The semiconductor device according to claim 1, wherein the suicide region includes a plurality of sub-regions separated from each other, each of the sub-regions coupled to a metal conductor.

7. The semiconductor device according to claim 6, wherein the suicide region comprises the plurality of sub-regions in an area close to the drain region of the first-conductive-type transistor in a circumferential direction of the second guard ring.

* * * * *